United States Patent
Leyrer et al.

(10) Patent No.: US 10,970,074 B2
(45) Date of Patent: Apr. 6, 2021

(54) BROADSIDE RANDOM ACCESS MEMORY FOR LOW CYCLE MEMORY ACCESS AND ADDITIONAL FUNCTIONS

(71) Applicant: TEXAS INSTRUMENTS INCORPORATED, Dallas, TX (US)

(72) Inventors: Thomas Anton Leyrer, Geisenhausen (DE); William Cronin Wallace, Richardson, TX (US); David Alston Lide, Rockville, MD (US); Pratheesh Gangadhar Thalakkal Kôttilaveedu, Bengaluru (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/424,913

(22) Filed: May 29, 2019

(65) Prior Publication Data

US 2019/0369996 A1 Dec. 5, 2019

Related U.S. Application Data

(60) Provisional application No. 62/677,878, filed on May 30, 2018, provisional application No. 62/786,479, filed on Dec. 30, 2018.

(51) Int. Cl.
| | |
|---|---|
| G06F 9/30 | (2018.01) |
| G06F 3/06 | (2006.01) |
| G06F 9/38 | (2018.01) |
| G06F 12/0875 | (2016.01) |
| G06F 9/48 | (2006.01) |
| G06F 30/34 | (2020.01) |

(52) U.S. Cl.
CPC ...... *G06F 9/30098* (2013.01); *G06F 9/30043* (2013.01); *G06F 9/3877* (2013.01); *G06F 9/4881* (2013.01); *G06F 12/0875* (2013.01); *G06F 30/34* (2020.01)

(58) Field of Classification Search
CPC ............................. G06F 9/30098; G06F 3/061
See application file for complete search history.

(56) References Cited

U.S. PATENT DOCUMENTS

| | | | | |
|---|---|---|---|---|
| 7,043,416 | B1* | 5/2006 | Lin ....................... | G06F 9/3842 702/183 |
| 8,947,931 | B1* | 2/2015 | D'Abreu ................ | G11C 5/025 365/185.05 |
| 2012/0278376 | A1* | 11/2012 | Bakos ................... | G06F 9/3001 708/607 |
| 2015/0206559 | A1* | 7/2015 | Priel ........................ | G11C 7/22 711/105 |

* cited by examiner

*Primary Examiner* — David E Martinez
(74) *Attorney, Agent, or Firm* — Brian D. Graham; Charles A. Brill; Frank D. Cimino

(57) ABSTRACT

A computational system includes one or more processors. Each processor has multiple registers, as well attached memory to hold instructions. The processor is coupled to one or more broadside interfaces. A broadside interface allows the processor to load or store an entire widget state in a single clock cycle of the processor. The broadside interface also allows the processor to move and store 32 bytes of information into RAM in less than four to five clock cycles of the processor while the processor concurrently performs one or more mathematical operations on the information while the move and store operation is taking place.

20 Claims, 5 Drawing Sheets

BROADSIDE RANDOM ACCESS MEMORY FOR LOW CYCLE MEMORY ACCESS AND ADDITIONAL FUNCTIONS

CROSS-REFERENCE TO RELATED APPLICATION

This application claims priority to U.S. Provisional Application No. 62/677,878, filed May 30, 2018, and U.S. Provisional Application No. 62/786,479, filed Dec. 30, 2018, both of which are fully incorporated by reference herein.

TECHNICAL FIELD

The present disclosure relates generally to an industrial control sub-system that can be formed as part of an integrated circuit, such as a digital signal processor (DSP), a system on a chip (SoC), an application specific integrated circuit (ASIC), or a field programmable gate array (FPGA). More specifically, the present disclosure relates to a broadside random-access memory (BS-RAM) component of such industrial control sub-system.

BACKGROUND

Many different communication protocols exist across different industries and market segments to address real-time communication for data exchange running on proprietary developed processing devices, such as SoCs, DSPs, ASICs and FPGAs. Attempts to provide processing devices capable of task switching at speeds suitable for industrial use cases, while maintaining flexibility to communicate in accordance with numerous protocols, have not been satisfactory. Hence, there is room for improvement in the art.

SUMMARY

At least one example of this disclosure includes a computational device, comprising: a processor, the processor having a register, an interface coupled to the register; and a broadside random-access memory (RAM) coupled to the interface, wherein the interface is configured to load accelerator state data to the register in a single clock cycle of the processor; the interface is further configured to enable 32 bytes of information to be stored in or retrieved from the broadside RAM within three clock cycles of the processor when the processor executes a store operation; and wherein the processor is configured to perform one or more mathematical operations on at least one portion of the 32 bytes of information during execution of the store operation.

At least one additional example of this disclosure includes a computer-implemented method, comprising: loading, using an interface, accelerator state data to a register in a single clock cycle of a processor coupled to the register; executing a store operation using the processor, wherein executing the store operation comprises storing 32 bytes of information to a RAM coupled to the interface, in less than four clock cycles of the processor; and performing, using the processor, one or more mathematical operations on at least one portion of the 32 bytes of information during execution of the store operation.

At least one further example of this disclosure includes a system on chip, comprising: a programmable real-time unit, the programmable real-time unit including a register, an interface circuit coupled to the register; and a random-access memory (RAM) coupled to the interface circuit, wherein the interface circuit is configured to load accelerator state data to the register in a single clock cycle of the programmable real-time unit; the interface circuit is further configured to enable 32 bytes of information to be stored in or retrieved from the RAM in within one clock cycle of the programmable real-time unit when the programmable real-time unit executes a store operation; and wherein the programmable real-time unit is configured to perform one or more mathematical operations on at least one portion of the 32 bytes of information during execution of the store operation.

BRIEF DESCRIPTION OF THE DRAWINGS

For a detailed description of various examples, reference will now be made to the accompanying drawings, in which.

DETAILED DESCRIPTION

Figure 1:
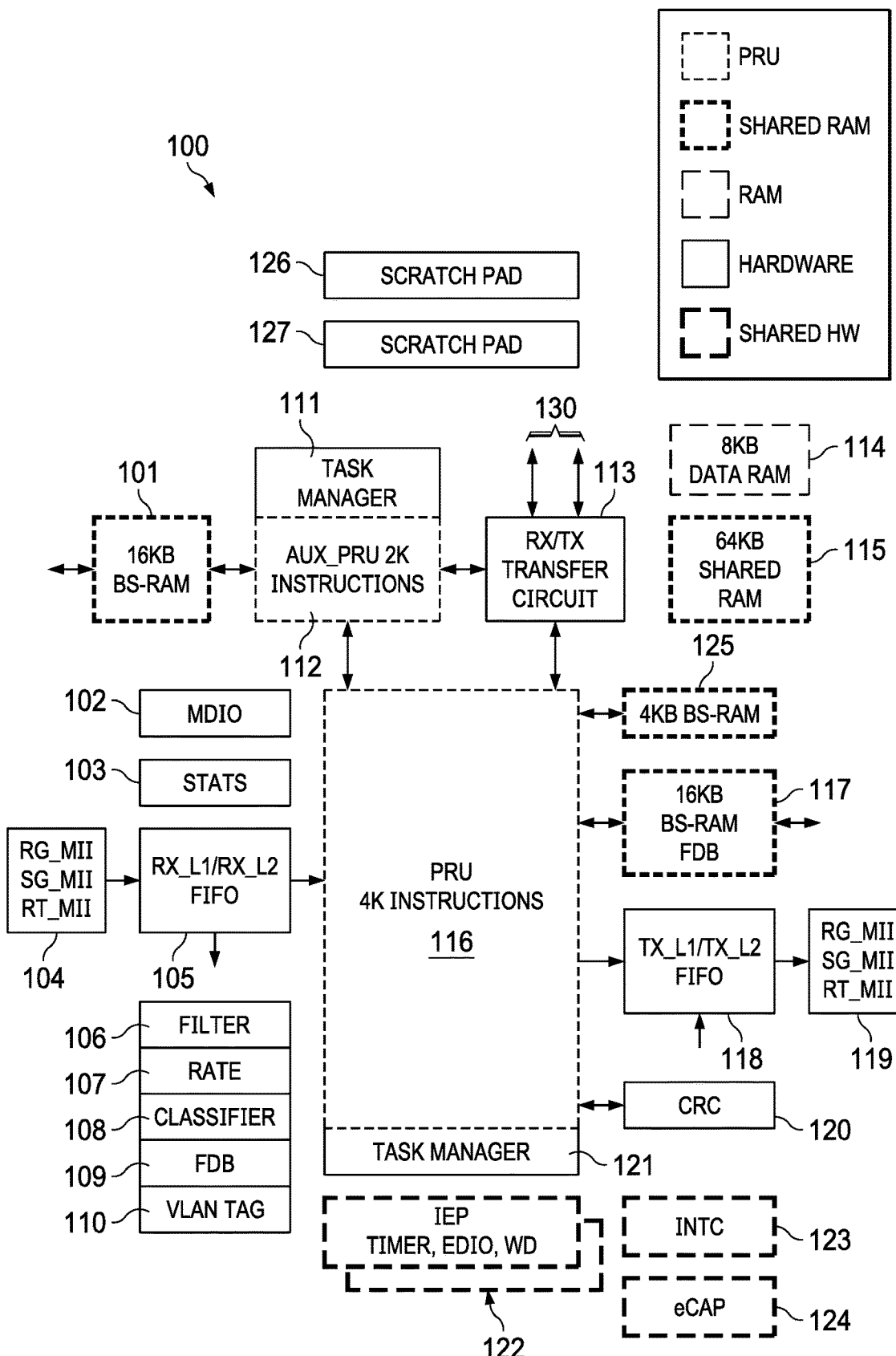
FIG. 1 illustrates a block diagram of an example of a system having an architecture in accordance with this disclosure.

One or more specific examples of the present disclosure are described below. These examples are only examples of the presently disclosed techniques. Additionally, in to provide a concise description of these examples, all features of an actual implementation may not be described in the specification. In the development of any such implementation, as in any engineering or design project, numerous implementation-specific decisions are made to achieve the developers' specific goals, such as compliance with system-related and business-related constraints, which may vary from one implementation to another. Moreover, it should be appreciated that such development efforts might be complex and time consuming, but would nevertheless be a routine undertaking of design, fabrication, and manufacture for those of ordinary skill having the benefit of this disclosure.

When introducing elements of various examples of the present disclosure, the articles "a," "an," and "the" are intended to mean that there are one or more of the elements. The terms "comprising," "including," and "having" are intended to be inclusive and mean that there might be additional elements other than the listed elements. The examples discussed below are intended to be illustrative in nature and should not be construed to mean that the specific examples described herein are preferential in nature.

The examples described in this disclosure are neither mutually exclusive nor collectively exhaustive. References to "one example" or "an example" are not to be interpreted as excluding the existence of additional examples that also incorporate the recited features.

When used herein, the term "medium" refers to one or more non-transitory physical media that together store the contents described as being stored thereon. Examples may include non-volatile secondary storage, read-only memory (ROM), and/or random-access memory (RAM).

As used herein, the terms "application" and "function" refer to one or more computing modules, programs, processes, workloads, threads and/or a set of computing instructions executed by a computing system. Example implementations of applications and functions include software modules, software objects, software instances and/or other types of executable code.

As noted, many different communication protocols have been developed across different industries and market segments to address real-time communication for data exchange running on proprietary developed processing devices, such as SoCs, DSPs, ASICs and FPGAs. Examples of this disclosure are directed towards providing and/or enabling multi-protocol flexibility for communication between such processing devices. At least one example of this disclosures is directed to providing and/or enabling real-time Ethernet communication at speeds of 1 Giga-bit/sec or faster.

At least one example of this disclosure is an architecture for an industrial communication subsystem (ICSS) which addresses the flexibility requirement of multi-protocol communications and the performance requirements of real-time gigabit Ethernet. With the integration onto catalog processors, the architecture makes industrial communication as easy as standard Ethernet. ICSS has a hybrid-architecture. In at least one example, ICSS includes four 32-bit reduced instruction set computer (RISC) cores called programmable real-time units (PRU) coupled with a set of tightly integrated hardware accelerators. Within this disclosure, hardware accelerators include hardware specially made to perform some functions more efficiently than would be possible using software running on a general-purpose central processing unit (CPU). A reduced instruction set computer (RISC) is a computer whose instruction set architecture (ISA) allows it to have fewer cycles per instruction (CPI) than a complex instruction set computer (CISC).

The combination of 128/256 gigabit/sec data transfer with deterministic programming resolution of four nanoseconds (ns) described herein is a highly differentiated approach to communication interfaces. A detailed view of the hardware accelerators in combination with 128/512 gigabit/sec data bus architecture is provided in FIGS. 2A-C. These accelerators can have multiple states, and data corresponding to those states can be loaded into a PRU register in a single clock cycle.

Examples of this disclosure pertain to programmable real-time unit (PRU) subsystems and industrial communication subsystems (ICSS), consisting of dual 32-bit RISC cores (PRUs), data and instruction memories, internal peripheral modules, and an interrupt controller (INTC). The programmable nature of the PRU-ICSS, along with their access to pins, events and all SoC resources, provides flexibility in implementing fast real-time responses, specialized data handling operations, custom peripheral interfaces, and in offloading tasks from the other processor cores of the SoC.

For Industrial Ethernet use cases, example ICSSs of this disclosure provide a balance between programmability (flexibility) and the need to keep up with wire rate packet load. In at least one example, PRUs run based on a 250 MHz clock, and thus the firmware budget is in some instances limited to approximately 84 cycles per packet (for minimum size transmits and receive frames). This budget can be insufficient for full 802.1D compliant packet processing at 1 GHz rates. Hence, example ICSSs include hardware accelerators for time consuming bridging tasks, such as broadside (BS) 512-bit/1024-bit hardware accelerators and broadside random-access memory (BS-RAM).

A PRU microprocessor core, in accordance with disclosed examples, has a load/store interface to external memory. Using data input/output instructions (load/store), data may be read from or written to external memory, but at a cost of stalling the core while accessing occurs. Conventionally, a read of N 32-bit words typically takes 3+N cycles, while a write takes around 2+N cycles. These read and write rates are too slow for some applications, (e.g., reading 32 bytes can take around 11 cycles). Examples of this disclosure address these issues.

A programmable core, in accordance with disclosed embodiments, also has a wide register load/store/exchange interface (referred to as broadside) that allows one cycle access to accelerators. A special set of instructions (xin/xout/xchng), that take a broadside identifier, the starting register for the transfer and number of bytes to transfer as arguments, are used to by firmware to access this interface. Our solution is to attach RAMs to this broadside interface. With this approach, firmware can transfer 32 bytes of data to or from the RAM in much lower cycles, often taking 1-2 cycles for stores of 32 bytes and 2-3 cycles for loads of 32 bytes.

In at least one example, a broadside RAM and/or broadside interface is optimized for wide transfers of 32 bytes. Lower transfer widths can be supported by padding the size to 32 bytes. In at least one example, the read location is first written to the attached RAM using the xout broadside instruction, and then the data is read using the xin broadside instruction. Thus, read operations will always take two cycles. For write transfers, the address is placed in the register just after the registers holding the 32 bytes of data, and the data plus address is transferred to the attached RAM in one xout instruction. In at least one example, this approach has the extra advantage of being able to also perform operations on the data, possibly in parallel with the transfer.

In addition to speeding up writes by at least a multiple of ten in conventional systems and reads by a multiple of five for 32-byte transfers, examples of this disclosure provide advantages such as the ability of the broadside (BS) interface to locally store the RAM address last accessed by the BS interface, which allows for an auto-increment mode of operation so firmware does not have to constantly update the address (especially useful for bulk reads). Examples of this disclosure enable useful operations on data using this interface in parallel with write operations. For example, cut-through data can be run through a checksum circuit to compute a running checksum of a packet while the packet is stored in the RAM. In at least one example, a processor can perform endian flipping on data within a packet at various data size boundaries. In at least one example, a data pivot/swap operation can be performed using a BS interface, for example to swap registers r2-r5 with r6-r9. A data pivot/swap operation is useful when moving data between interfaces with different block sizes (e.g., from a 32-byte first-in-first-out (FIFO) receiver (RX) FIFO to a 16-byte packet streaming interface). In at least one example, by using a different BS identifier (ID) (a parameter to a broadside instruction) to associate an organization to the attached memory or to enable independent memory 'views' by different firmware tasks. The broadside IDs can map to different read or write memory addresses (maintained by glue logic) so that data structures, such as first-in-first-out (FIFO), and queues can be implemented by the attached RAM in a flexible and firmware managed manner. At least one example utilizes embedded processing. In at least one example, the glue logic between the RAM and the broadside interface locally stores the RAM address last accessed, which allows for an auto-increment mode of operation so that the firmware of the PRU does not have to constantly update the RAM address. The auto-increment mode of the PRU is useful for bulk data reads.

In at least one example of this disclosure, a broadside RAM is accessible by hardware components to perform such operations as creating one or more forwarding databases.

In at least one example of this disclosure, a hardware filter and classifier enables receive and forwarding decisions relating to packets with minimum bridge delay. In an example, a combination of content, time window and data rate provides a robust ingress classification for Ethernet bridging while maintaining minimum bridge delay. Examples of this disclosure enable bridge delays of less than a microsecond.

FIG. 1 is a functional block diagram of a system 100 (which can be a component of a SoC 130) based on ICSS architecture in accordance with one example of this disclosure. In FIG. 1, a 16-Kilobyte broadside random-access memory (BS-RAM) 101 is coupled to (in signal communication with) AUX_PRU 112. The BS-RAM 101 is coupled to the PRU 116 via AUX_PRU 112. BS-RAM 101 can transfer 32 bytes of data in one clock cycle of the system 100. BS-RAM 101 has an ultra-high bandwidth and ultra-low latency. Within this disclosure, coupled components (e.g., circuits) are able to communicate with each other. Connected components are those which are coupled via a direct connection or an indirect connection. Within this disclosure, components which are coupled to one another are also connected, unless an indication to the contrary is provided.

As illustrated in FIG. 1, data coming in through interface circuit 104 (which is a real-time interface) is passed to FIFO receive circuit 105. As data goes through the receive circuit 105, classifier 108 is applied to this incoming data. The filter 106, the rate counter 107, and combinational logic of classification engine 108 are applied to received data packets.

Management data input/output (MDIO) circuit 102 is a media interface. MDIO circuit 102 uses PRU 116 to communicate with an external reduced gigabit media-independent interface (RGMII) physical layer and a media-independent interface (MII) physical layer, (interface circuit 104, interface circuit 119). MDIO circuit 102 has low latency and is dedicated to PRU 116. As shown in FIG. 1, the system 100 also includes a statistics counter circuit 103, which tracks statistics of the Ethernet ports of real-time interface circuit 104, such as packet sizes, errors, etc. Real-time interface circuit 104, comprising RGMII, serial gigabit media-independent interface (SGMII), and real-time media-independent interface 231, 259 (RTMII) is a hardware layer which connects to the input/outputs (IOs) of system 100, such as MDIO circuit 102. Real-time interface circuit 104 is coupled to FIFO receive circuit 105, which includes a level one first-in-first-out (FIFO) receiving layer (RX_L1) and a level two FIFO receiving layer (RX_L2). FIFO receive circuit 105 can receive level one FIFO data and level two FIFO data.

As noted, system 100 includes filter 106, which is a filter for eight filter type 1 data streams and/or sixteen filter type 3 data streams. Filter 106 determines whether a given data packet is a particular "type" of data packet. Filter type 3 data packets have a variable start address depending on whether packets are communicated with a virtual LAN. System 100 also includes a rate tracker 107. In at least one example, the system 100 includes eight rate trackers 107. Based on a filter type hit rate, rate tracker 107 calculates the throughput rate of FIFO receive circuit 105. The system 100 also includes filter database (FDB) 109. FDB 109 is used for routing and redundancy. Receive circuit 105 includes a level one receiving layer (RX_L1) and a level two receiving layer (RX_L2), which include physical receive ports. Level one receiving layer (RX_L1) and level two receiving layer (RX_L2) of receive circuit 105 can access FDB 109 to manage receiving and forwarding decisions based on an IEEE802.1Q learning bridge mode 1. FDB 109 contains a lookup table (LUT) storing results which can be given to PRU 116 to assist PRU 116 in making data routing decisions. In at least one example, system 100 also includes virtual local area network tag (VLAN TAG) circuit 110. (A tag (a/k/a 'ID') is a keyword or term assigned to a piece of information (such as an Internet bookmark, digital image, database record, computer file, or VLAN). Statistics tracker 103, filter 106, rate tracker 107, classifier 108, FDB 109, and VLAN TAG 110 are aspects of receive circuit 105.

MDIO circuit 102 controls interaction with the external physical layer (not shown) of the system in accordance with the open systems interconnection (OSI) model. The physical layer connects a link layer device such as medium access controller (MAC) (see 206 (266) and 220 (290) of FIG. 2A, and 266 and 290 of FIG. 2C) to a physical medium of a host (e.g., 246) device/system) of which the subsystem 200 is a component or to which the subsystem 200 is coupled. The physical layer includes both physical coding sublayer (PCS) functionality and physical medium dependent (PMD) layer functionality. There is a transceiver external to the SoC 130 in which system 100 is embedded. The MDIO circuit 102 configures one or more external physical layers (not shown) and serves to minimize latency of the ICSS.

Every central processing unit (CPU), such as programmable real-time unit 116 includes a task manager circuit (e.g., task manager circuit 111). In at least one example, task manager circuit 111 and task manager circuit 121 can recognize 200 events or more. Events correspond to hardware status signals such as from the filter 106, from the rate tracker 107, or from interrupt controller 123. AUX_PRU 112 is responsible for control. For instance, based upon a starter frame, PRU-RTU 112 detects that a new packet is going to the data processor—PRU 116—and, in parallel to the data processor's collecting the data, PRU-RTU 112 will set up the address and direct memory access (DMA) per packet as needed for the packet to go to the host (130, 246). While data is being pushed to the BS-RAM 117, the data can also be pushed to a checksum accelerator such as CRC 120. Thus, CRC 120 can hang of off BS-RAM 117. Transfer circuit 113 communicates with AUX_PRU 112 and PRU 116. Transfer circuit 113 can receive (RX) and transmit (TX) information, as indicated by the notation 'RX/TX' in FIG. 1. Transfer circuit 113 is configured with DMA, which enables both AUX_PRU 112 and PRU 116 to access main system 100 memory. When AUX_PRU 112 or PRU 116 initiates a transaction, transfer circuit 113 will manage data movement to SoC 130 memory to either pull or push data. Transfer circuit 113 is thus a general asset that can be used for data transfers. In at least one example, in the architecture of FIG. 1, the AUX_PRU 112 can control address location while the PRU 116 pushes data. Thus, the architecture is flexible in that a single CPU e.g., (112, 116) is not responsible for both data management and control functions.

In at least one example subsystem 100, there exists a fabric having local memory. The fabric in the example subsystem 100 of FIG. 1 can be 4-byte wide. There are however, two banks of data memory 114 dedicated to each CPU (e.g., 112, 116), and another bank of larger memory 115 is shared across CPUs (112, 116). Data memory 114 can be used with scratchpad 126 and scratchpad 127, while shared memory 115 is used for a link-list which is used for DMA or for storing metadata. A scratchpad 126, 127 is like BS-RAM 101,117. Scratchpad 126 and scratchpad 127 are different from BS-RAM 101 and BS-RAM 117 however, in that scratchpads 126, 127 are shared amongst slices (see slice_0 of FIG. 2A and slice_1 of FIG. 2C) and, scratchpads 126, 127 are more flexible than BS-RAM 101,117. A scratchpad (e.g., 126, 127) can save and/or restore a register set. Scratchpads 126, 127 can be used for slice to slice communication and to perform barrel shifting or remapping of a register set to a physical location. BS-RAM 117 is similar to BS-RAM 101 except BS-RAM 117 also has a FDB which includes a look up table. When a packet comes in enters system 100 at receive circuit 105, hardware performs a look up to FDB 109 and presents the data to the PRU 116. Based on the response of the FDB of BS-RAM 117, the PRU 116 makes a routing decision, such as whether to route the received packet to the host via transfer circuit 113 and/or to a different port, such as through transmit circuit 118. PRU 116 also accesses BS-RAM 125. PRU 116 acts as a switch, while BS-RAM 117 enables actions to be performed concurrently. BS-RAM 117 is thus a dual use component. Hardware can be connected to the BS-RAM 117 while the BS-RAM 117 performs look ups to the FDB 109 for the PRU 116. Just as a check sum can be performed by CRC 120 at the same time RAM (e.g. 114) is being loaded, while the BS-RAM 125 is interacting with hardware, an FDB operation can be performed by BS-RAM 117 for PRU 116.

Transmit circuit 118 handles the egress of data from the PRU 116. Transmit circuit 118 performs preemption, tag insertion, and padding. Transmit circuit 118 enables firmware to terminate a packet cleanly. Thereafter task manager circuit 121 will perform the necessary steps to generate a final CRC and the transmit circuit 118 will perform padding if the packet in question is small. The transmit circuit 118 can insert a tag so that PRU 116 does not have to keep track of the packet. The transmit circuit 118 is thus able to assist the hardware of the SoC 130. The transmit circuit 118 is coupled to interface circuit 119. Interface circuit 119 is a final layer. External to transmit circuit 118 there exist different media independent interfaces, for example RGMIIs, SGMIIs, and real-time Mils (see 104, 119, 225 (295)). Other types of interfaces on the system 100 are also possible within this disclosure. FIFO transmit circuit 118 is agnostic with respect to such interfaces. Interface circuit 119 is a de-multiplexer. Interface circuit 119 provides protocol conversion for transmit circuit 118, enabling transmit circuit 118—and hence PRU 116—to communicate with a given piece of hardware in a protocol which is suitable for that hardware. PRU 116 and transmit unit 118 are thus not constrained to operating in a manner which corresponds to only one protocol, making PRU 116 and transmit circuit 118 more versatile than they would be absent interface circuit 119. In at least one example of this disclosure, the system 100 pins down data streams of interface circuit 119 to connect to an external physical layer. Transmit circuit 118 has a level one FIFO transmit layer (TX_L1) and a level two FIFO transmit layer (TX_L2), referring to levels of the open systems interconnection (OSI) model. Level (or 'layer') one corresponds to the physical layer of the OSI model and level two corresponds to a data link layer of the OSI model. This dual layer connectivity provides options. For example, the level two FIFO transmit layer (TX_L2) can be bypassed and data can be sent to the level one FIFO transmit layer (TX_L1), which reduces latency. In at least one example, the level two FIFO transmit layer (TX_L2) has a wider interface than does the level one FIFO transmit layer (TX_L1). In at least one example, the level two FIFO transmit layer (TX_L2) has a 32-byte interface, whereas the level one FIFO transmit layer (TX_L1) has a 4-byte interface. In at least one example, if at the receive circuit 105 a data packet goes from level one receiving layer (RX_L1) to the level two receiving layer (RX_L2) 272 (257), and the PRU 116 accesses the packet at the level two receiving layer (RX_L2), the data will be pushed to the level two FIFO transmit layer (TX_L2) of FIFO transmit circuit 118 first, and then the hardware of FIFO transmit circuit 118 will push the data packet directly to the level one FIFO transmit layer (TX_L1). However, when communicating with ultra-low latency interfaces such as EtherCAT, the level two FIFO transmit layer (TX_L2) can be bypassed; the data that is output from PRU 116 can be pushed directly to level one FIFO transmit layer (TX_L1), (which, as noted, has a 4-byte width).

Interface circuit 104 and interface circuit 119 are connected to the physical layer ("level zero" of the OSI model). Data thus enters system 100 at level zero through interface circuit 104, is moved from level zero to either level one receiving layer (RX_L1) of FIFO receive circuit 105 or level two receiving layer (RX_L2) 272 (257) of FIFO receive circuit 105, to the PRU 116, (which exists at both level one and level 2), and from level one or level two of PRU 116 through the FIFO transmit circuit 118 and back down to level zero at interface circuit 119. In at least one example, cyclical redundancy check (CRC) circuit 120 is an accelerator which assists PRU 116 perform calculations. The PRU 116 interfaces with the CRC circuit 120 through BS-RAM 117. The CRC circuit 120 applies a hash function to data of the PRU 116. The CRC circuit 120 is used to verify the integrity of data packets. For example, all Ethernet packets include a CRC value. The CRC circuit 120 performs a CRC check on a packet to see if the CRC value of the packet agrees with the result calculated by the CRC circuit 120. That is, a packet includes a CRC signature and after the signature is calculated, the result is compared with the signature that is attached to the packet to verify the integrity of the packet.

System 100 also includes interrupt controller (INTC) 123. INTC 123 aggregates and CPU (e.g., AUX_PRU 112, PRU 116) level events to host (e.g., 130, 146) events. There may be, for example, ten host events. INTC 123 determines that a given set of slave level events should be aggregated, mapped, and classified down to a single entity. The single entity can be routed to and used by the PRU 116 or the task manager circuit 121 to cause an event for the host (130, 146). In that sense, INTC 123 is both an aggregator and a router.

Enhanced/external capture (eCAP) circuit 124 is a timer which enables PRU 116 to generate an output response based upon a time match with industrial Ethernet peripheral (IEP) circuit 122, and captures event time for events external to system 100.

IEP circuit 122 has two sets of independent timers which enable time synchronization, time stamping, and quality of service for egress of data out of system 100. There are several independent capture circuits associated with IEP circuit 122. For example, if there is a receive (RX) starter frame event and it is important the frame be pushed to the host at a specific time, the IEP circuit 122 can time stamp the event to indicate that specific time. If the event is a time triggered send for the egress circuit 118, if it is desirable to transfer a packet at a precise time (within 2-3 nanoseconds), transmission of the packet begins when the timer expires, independent of the PRU 116. Thus, the transfer of the packet is effectively decoupled from the PRU 116.

In addition to the timers described, IEP circuit 122 also contains enhanced digital input/output interfaces (EDIO). An EDIO is similar to a general-purpose input/output (GPIO) interface, but is more intelligent and better calibrated for Ethernet communications. For example, a transmit-started or receive-started frame might cause an event on the EDIO which can in turn cause an event external to the SoC 130. Sync-outs and latches-in are part of time synchronization. It is also possible for IEP 120 to receive a frame and capture an analog voltage. In conventional systems this would require a read operation. But with EDIO, a capture can be event triggered and/or time triggered, thus making capture more precise than in conventional systems. The EDIO enables the system 100 to determine with precision when an incoming frame arrives, which in turn enables the system 100 to sample one or more specific values (such as temperature, voltage, etc.) and track with precision when a sample was taken because of time stamping by the IEP circuit 122. The frame in question can be augmented. When the frame is transmitted by transmit circuit 118 the frame can contain the time-stamped sampled value without leaning overhead or latency. IEP circuit 122 also includes a watch dog (WD) timer. Certain events should occur under normal operating conditions. When such events occur, the PRU 116 will normally clear the WD timer. If the WD timer fires that means the PRU 116 did not clear the WD timer in time, or did not reset the WD timer in time, which indicates there was a stall or some type of latency that was not expected. The WD timer thus serves to track errors.

As noted, task manager circuit 111 and task manager circuit 121 can recognize a great number of events. PRU 116 is the main data engine of system 100. When a frame is started, the system 100 begins preparing and servicing receiving circuit 105. Once a frame is in transmit circuit 118, inputting of the next packet can begin. Because the PRU 116 is the main processor, the PRU 116 needs to have access to all events in real-time. Another operation associated with PRU 116 is watermarking. A watermark can be created at interface circuit 105, receive circuit 105, transmit circuit 118, and interface circuit 119. It is less advantageous to wait until the FIFO is full or empty before loading or unloading packets. In at least one example of this disclosure, when a certain amount of emptiness (or fullness) is reached, task manager circuit 121 will emit a signal, and the PRU 116 will determine whether the packet will be watermarked.

An aspect of the BS-RAM 117 is that it enables PRU 116 to snoop a data packet at the same time the system 100 saves contexts and variables at the BS-RAM 117; operations can be performed on the contexts and variables with no overhead costs because the data of the packet does not need to be moved twice. In at least one example of this disclosure, an incoming data packet can be moved to a storage location and at the same time the data is operated upon. This differs from conventional systems which move an incoming packet to a processing circuit and subsequently to a storage location. The system 100 thus performs a single operation where a conventional system would perform two.

As noted, AUX_PRU 112 interacts with BS-RAM 101. AUX_PRU 112 has a task manager circuit 111 which can preempt PRU 116 based on the occurrence of certain events or context swaps. AUX_PRU 112 also interacts with transfer circuit 113. In at least one example, a system 100 in accordance with this disclosure also includes eight kilobytes of data RAM 114 and 64 kilobytes of shared RAM 115. AUX_PRU 112 and transfer circuit 113 both interact with PRU 116. Task manager circuit 121 enters real-time tasks for receive and transmit processing based on FIFO watermarks.

PRU 116 is also coupled to 16-kilobyte BS-RAM filter database 117. Output from PRU 116 goes to FIFO transmit circuit 118. In turn, output from FIFO transmit circuit 118 goes to real-time interface circuit 119. PRU 116 also interacts with CRC 120, which calculates checksums inside an ethernet packet. In at least one example, system 100 includes IEP/timer/EDIO/WD circuit(s) 122. As noted, the system 100 can also include interrupt controller (INTC) 123 and eCAP circuit 124.

Figure 2A:
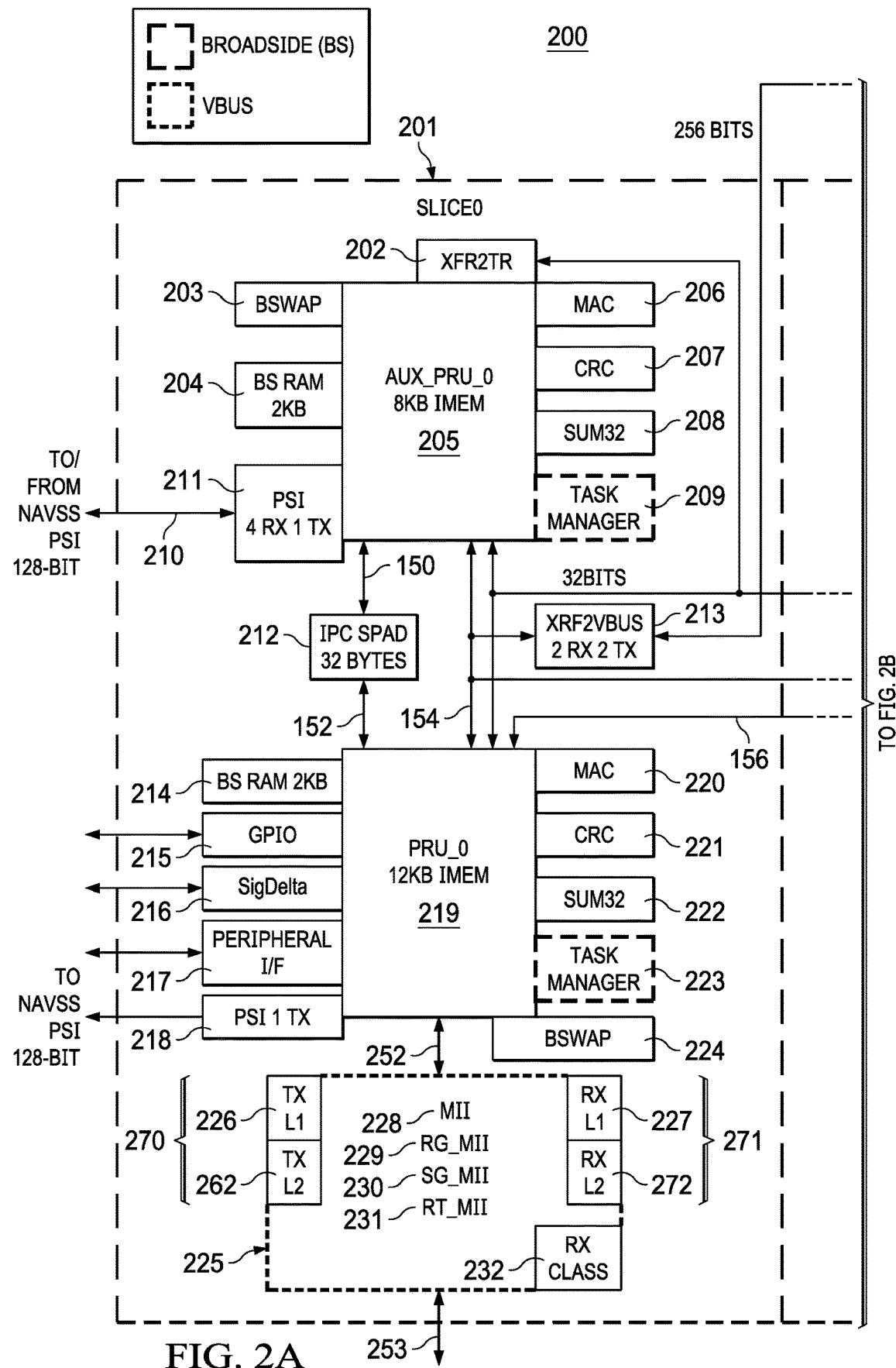
FIGS. 2A-C illustrates an example industrial communication subsystem incorporating many components from FIG. 1.
Figure 2B:
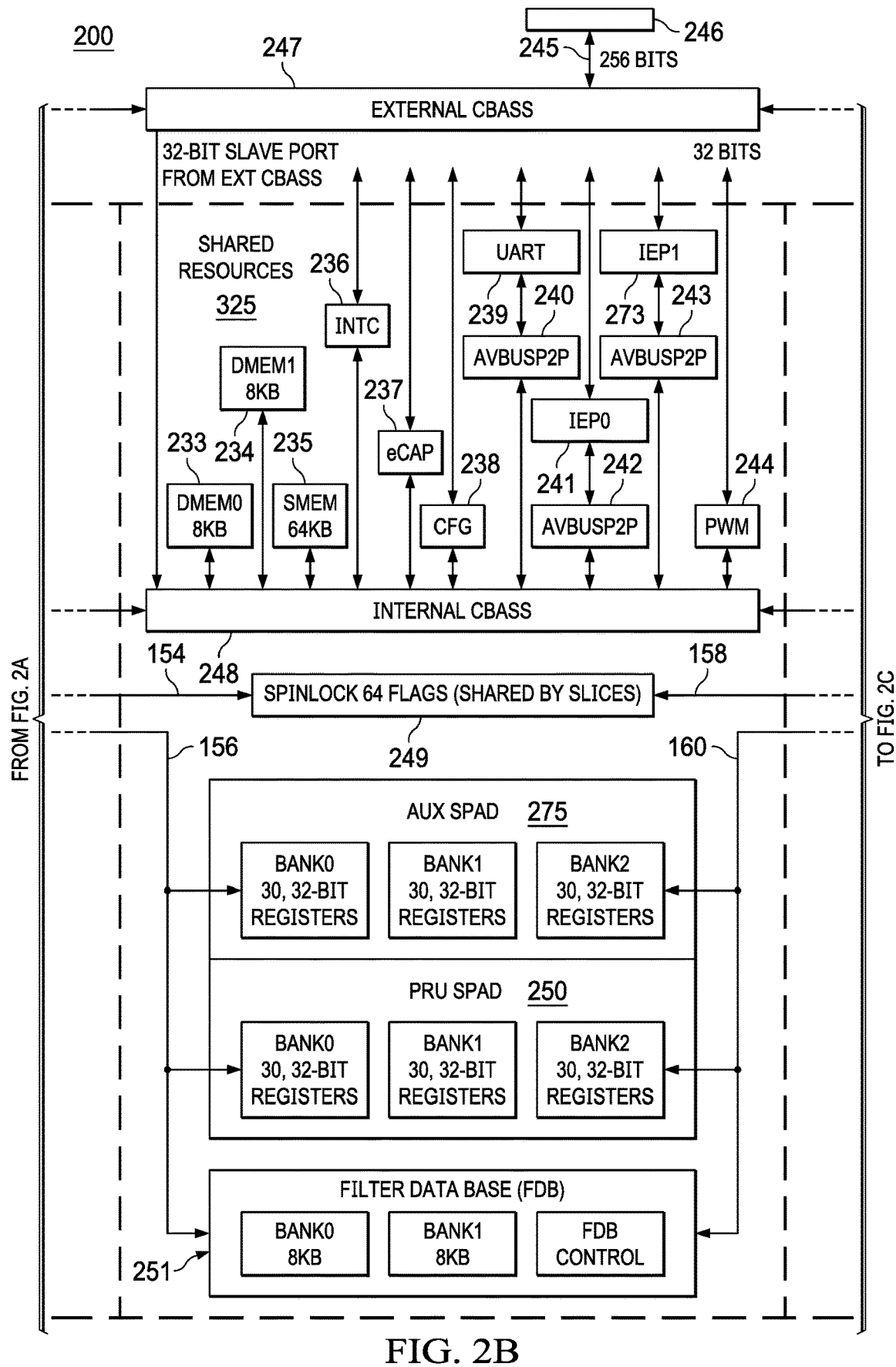
Figure 2C:
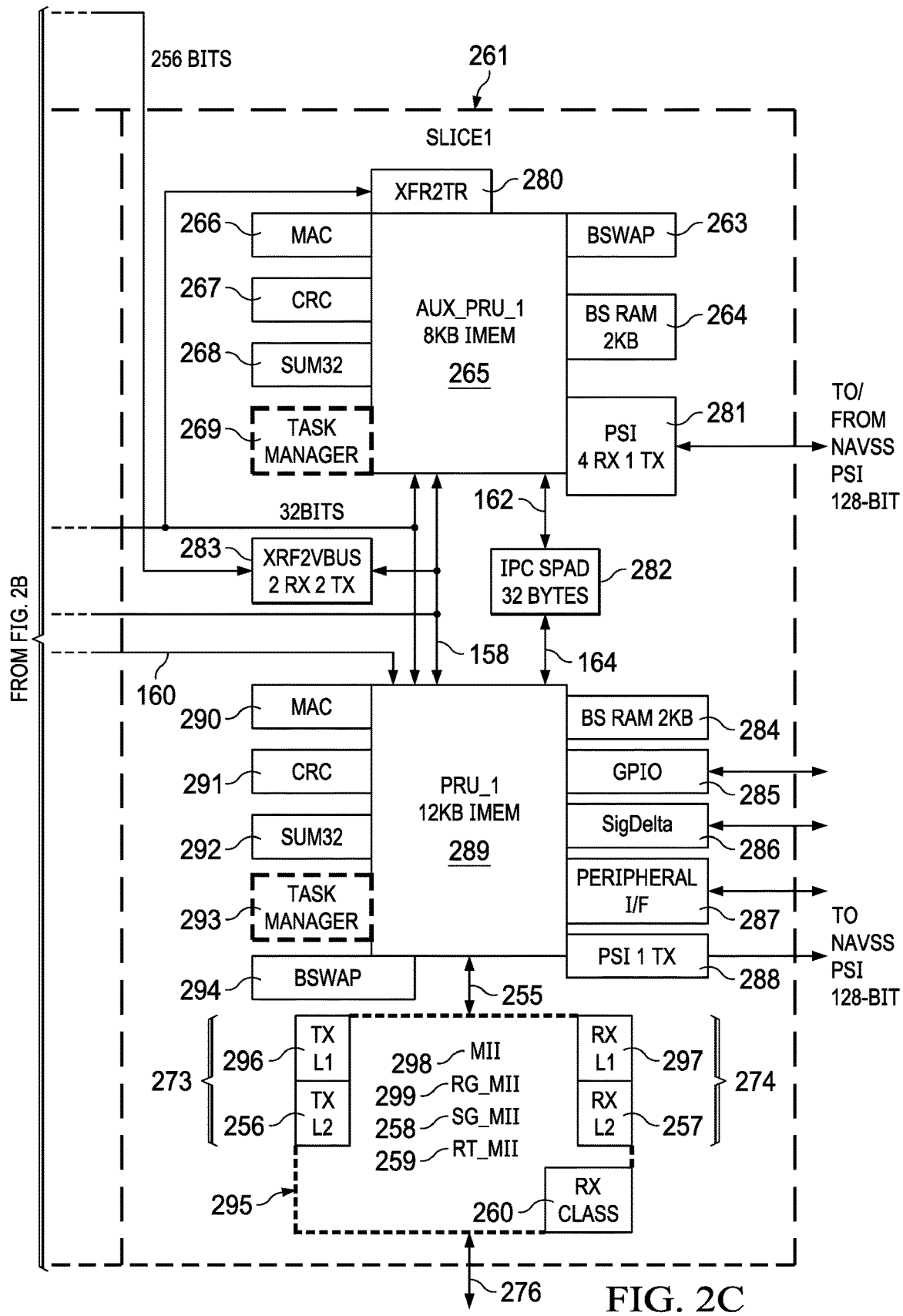

FIGS. 2A-C illustrate an example industrial communication subsystem (ICSS) (hereinafter simply subsystem 200). FIGS. 2A-C illustrate many of the same components as shown in FIG. 1, but in varying detail. Descriptions set forth regarding FIG. 1 are germane to FIGS. 2A-C, and vice versa. Slice_0 201, on the left of internal bus 248 and external bus 247, is symmetrical to slice_1 261 on the right. (Note, like alphabetical designations indicate like components.) Descriptions of components in slice_0 201 apply to their counterparts in slice_1 261. Subsystem 200 includes processing hardware elements, such as auxiliary programmable real-time unit (AUX_PRU_0) 205 and PRU_0 219 which contain one or more hardware processors, where each hardware processor may have one or more processor cores. In at least one example, the processor (e.g., AUX_PRU_0 205, PRU_0 219) can include at least one shared cache that stores data (e.g., computing instructions) that are utilized by one or more other components of the processor (AUX_PRU_0 205, PRU_0 219). For example, the shared cache can be a locally cached data stored in a memory for faster access by components of the processing elements that make up the processor (AUX_PRU_0 205, PRU_0 219). In some cases, the shared cache can include one or more mid-level caches, such as a level 2 cache, a level 3 cache, a level 4 cache, or other levels of cache, a last level cache, or combinations thereof. Examples of processors include, but are not limited to a CPU microprocessor. Although not explicitly illustrated in FIG. 2, the processing elements that make up processor AUX_PRU_0 205 and processor PRU_0 219) can also include one or more other types of hardware processing components, such as graphics processing units, ASICs, FPGAs, and/or DSPs. Another accelerator of PRU_1 is BSWAP circuit 224 (294). BSWAP circuit 224 (294) can swap words depending on the size of the packet in question, little endian and/or big endian. BSWAP circuit 224 (294) can re-order of the bytes in a packet, depending on the word size.

Subsystem 200 includes slice_0 201 which is mirrored by slice_1 in FIG. 2C. As can be seen in FIG. 2A, slice_0 201 has multiple components. The main components are auxiliary PRU (AUX_PRU_0) 205, PRU_0 219 and MII 25. AUX_PRU_0 205 has a number or accelerators (a/k/a widgets). AUX_PRU_0 205 serves as the control processor of slice_0 201. Throughout this disclosure, the terms 'control processor,' 'AUX_PRU,' and 'RTU_PRU' are synonymous and interchangeable unless indicated otherwise or dictated by the context in which they appear, though their functions and configurations can differ.

FIG. 2A illustrates that memory (e.g., 204 (264)) can be operatively and communicatively coupled to AUX_PRU_0 205. Memory 204 (264) can be a non-transitory medium configured to store various types of data. For example, memory 204 (264) can include one or more storage devices which comprise volatile memory. Volatile memory, such as random-access memory (RAM), can be any suitable non-permanent storage device. In certain instances, non-volatile storage devices (not shown) can be used to store overflow data if allocated RAM is not large enough to hold all working data. Such non-volatile storage can also be used to store programs that are loaded into the RAM when such programs are selected for execution.

Software programs may be developed, encoded, and compiled in a variety of computing languages for a variety of software platforms and/or operating systems and subsequently loaded and executed by AUX_PRU_0 205. In at least one example, the compiling process of the software program may transform program code written in a programming language to another computer language such that the AUX_PRU_0 205 is able to execute the programming code. For example, the compiling process of the software program may generate an executable program that provides encoded instructions (e.g., machine code instructions) for AUX_PRU_0 205 to accomplish specific, non-generic computing functions.

After the compiling process, the encoded instructions can then be loaded as computer executable instructions or process steps to AUX_PRU_0 205 from storage 220 (290), from memory 210, and/or embedded within AUX_PRU_0 205 (e.g., via a cache or on-board ROM). In at least one example AUX_PRU_0 205 is configured to execute the stored instructions or process steps to perform instructions or process steps to transform the subsystem 200 into a non-generic and specially programmed machine or apparatus. Stored data, e.g., data stored by a storage device 220 (290), can be accessed by AUX_PRU_0 205 during the execution of computer executable instructions or process steps to instruct one or more components within the subsystem 200.

FIG. 2B illustrates component and resources shared by slice_0 201 of FIG. 2A and slice_1 of FIG. 2C. FIG. 2C comprises the same hardware as FIG. 2A. Slice_0 201 and slice_1 261 are symmetrical about FIG. 2B. Descriptions within this disclosure pertaining to FIG. 2A apply mutatis mutandis to FIG. 2C. Subsystem 200 includes a port 253 at slice_0 201 and a corresponding port 276 on slice_1 261. There is a third port (see FIG. 2B), host port 245; host port 245 connects subsystem 200 to the host 246, of which subsystem 200 can be a component. Port 253 and port 276 can both be connected to the Ethernet. Subsystem 200 can thus serve as a three-port switch. Host 246 can be a local source/sync or a SoC (130). While subsystem 200 option can be an SoC (130) in and of itself, in some implementations, subsystem 200 will be a subcomponent of a greater SoC (130). The host 246 will, in some examples, be a CPU from ARM Holdings PLC of Cambridge, England, UK. In at least one example, host 246 comprises several CPUs. There is exist a variety of CPUs. An example of a small CPU is the Arm Cortex-R5-CPU. An example of a large CPU is the Arm Cortex-A57-CPU. In at least one example subsystem 200 can be controlled by another such CPU.

Subsystem 200 includes XFR2TR circuit 202 (FIG. 2A), which interacts with internal configurable bus array subsystem (CBASS) 248 (FIG. 2B). The 'XFR' in XFR2TR circuit 202 (280) stands for transfer. XFR2TR circuit 202 (280) has a broadside interface. XFR2TR circuit 202 (280) is abutted to AUX_PRU_0 205 via the broadside interface of the XFR2TR circuit 202 (280). Internal register sets of the AUX_PRU_0 205 are exposed to accelerators MAC 206, CRC 207 (267), SUM32 circuit 208 (268), byte swap (BSWAP) circuit 203 (263), and BS-RAM 204 (264). In at least one example subsystem 200 of this disclosure, internal register sets of AUX_PRU_0 205 are directly exposed to accelerators such as those referenced above, differs from the architectures of conventional systems. In conventional systems a load-store operation over the fabric would be required for the AUX_PRU_0 205 to access an accelerator. In the example shown in FIG. 2, however, the accelerators are—in effect—part of the data path of AUX_PRU_0 205. The AUX_PRU_0 205 can import and export its register files to a given accelerator (a/k/a 'widget') based upon a given register's broadside ID. For example, XFR2TR circuit 202 (280), which is part of a DMA, can perform a transfer request. A transfer request (TR) can begin with a start address to start data movement a designation of the amount of data to be moved (for example, 200 bytes). XFR2TR circuit 202 (280) can perform a simple DMA memory copy of SMEM 235 which contains a list of predetermined transfer requests (TRs). Software running on AUX_PRU_0 205 is aware of the list of preexisting TRs of SMEM 235. In operation, AUX_PRU_0 205 sends an instruction to a DMA engine to move data. Since transfer instructions can be extremely complicated and/or complex, predefined instructions reside within a 'work order pool' stored in SMEM 235. Based on the type of packet in question, AUX_PRU_0 205 determines which 'work orders' should be used, and in what sequence, to cause the packet to be sent to the correct destination. The XFR2TR circuit 202 (280) can create a work order list as directed by AUX_PRU_0 205, and once the work order list is created, the XFR2TR circuit 202 (280) will notify a DMA engine (not shown). The DMA engine will then pull the designated work orders from SMEM 235 and execute the pulled work orders. The XFR2TR 202 (280) thus minimizes the computational overhead and transfers necessary to build a DMA list, like a link list to perform the data movement. TR stands for transfer request.

Another accelerator of AUX_PRU_0 is BSWAP circuit 203 (263). BSWAP circuit 203 (263) can swap words depending on the size of the packet in question, little endian and/or big endian. BSWAP circuit 203 (263) can re-order of the bytes in a packet, depending on the word size. BSWAP circuit 203 (263) is thus an accelerator which will automatically perform such swaps. BS-RAM 204 (264) corresponds to the BS-RAM 101 discussed regarding FIG. 1. BS-RAM 204 (264) is tightly coupled to AUX_PRU_0 205. When the AUX_PRU_0 205 pushes data element to BS-RAM 204 (264), a CRC for that element can be calculated simultaneously by CRC 207 (267) or a checksum for the data element be calculated simultaneously by checksum circuit 208. Based upon the data packet's ID, the AUX_PRU_0 205 will snoop for the necessary transaction(s), (for example checksum, multiply, accumulate, etc.) concurrently, meaning that pushing the data element to BS-RAM 204 (264) and performing an accelerator action constitute a single transaction rather than a double transaction. This simultaneity of operations is enabled by the BS-RAM 204 (264) in that BS-RAM 204 (264) can enable and/or disable the functions of the widgets while data is being transferred to physical RAM (for example, data RAM 114 and shared RAM 115 shown in FIG. 1).

Peripherals BSWAP 203 (263), XFR2TR circuit 202 (280), MAC 206 (266), CRC 207 (267), and SUM32 208, while illustrated as external to BS-RAM 204 (264) for explanatory purposes, will, under most operating conditions, be embedded within BS-RAM 204 (264). Multiplier-accumulator (MAC) 206 (266) is a simple accelerator comprising a 32-bit by 32-bit multiplier and a 64-bit accumulator. Cyclic redundancy check (CRC) circuit 207 (267) performs redundancy checks cyclically. CRC circuit 207 (267) supports different polynomials. Checksum circuit 208 is like CRC circuit 207 (267) except that checksum circuit 208 uses a hash operation to determine the integrity of a payload at AUX_PRU_0 205 before performing a checksum on the payload.

Task manager circuit 209 is a key part of AUX_PRU_0 205. Task manager circuit can prompt AUX_PRU_0 205 to execute a given function based on which of 196 (or more) events is detected.

There are two ways that data can be moved in and out of the subsystem 200 and to and from SoC 130 memory and/or to an external device. One way is through the packet streaming interface (PSI) 211 (281), which provides the ability to push data to a host (e.g., 246) and to pull data from the host (e.g., 246). This action of PSI 211 (281) is unlike a read request. Rather the master (writer) component of PSI 211 (281) is attached to AUX_PRU_0 205. There is a mapping of received packets to a destination. The destination, under normal operating conditions, will be ready to receive the packets. For that reason, PSI 211 (281) does not read data, but instead transmits data to a destination endpoint. PSI 211 (281) receives data from and sends data to navigation subsystem (NAVSS) 210. NAVSS 210 enables complex data movement. NAVSS 210 has a DMA engine and an advanced TR called a re-engine. NAVSS 210 supports PSI 211 (281) and can map PSI 211 (281) to other devices, such as via peripheral component interconnect express. Using PSI 211 (281), data can go directly from ICSS to peripheral component interconnect express while bypassing the host and/or a main DMA engine, enabling streaming data from one Ethernet interface (for example, interface circuit 225 (295)) and to another interface such as a universal serial bus or peripheral component interconnect express.

AUX_PRU_0 205 communicates with inter-processor communication scratch pad (IPC SPAD) 212 (282), which in turn also communicates with PRU_0 219. IPC SPAD 212 (282) is not a temporary SPAD that is owned by a single CPU. In at least on the purpose of IPC SPAD 212 (282) is to be able to transfer data or full controller status across AUX_PRU_0 205 and PRU_0 219. Transfer-to-virtual-bus circuit (XFR2VBUS) circuit 213 (or simply 'transfer circuit 213') corresponds to the transfer circuit 113 shown in FIG. 1 and operates in the same way as transfer circuit 113. Transfer circuit 213 (283) is attached to BS-RAM 214 (284). Transfer circuit 213 (283) has a broadside interface with external CBASS 247, internal CBASS 248, and spinlock circuit 249. Transfer circuit 213 can request reads and writes from memory (e.g., 204, 214) to broadside, and from broadside memory. This read/write function is different from a read/write operation such as at dedicated memory (DMEMO) 233. A conventional DMA copy operation would move information in SoC (130) memory to DMEMO 233 or to shared memory SMEM 235. The internal CBASS 248 is the network-on-chip for subsystem 200.

Internal CBASS 248 is 4-bytes wide. In at least one to access internal CBASS 248, a load and store operation must be performed, which is a high latency low throughput operation. However, using the tightly coupled and more direct transfer circuit 213 (283) reduces latency and overhead, while also providing greater bandwidth because of the broadside width of transfer circuit 213 (283). Thus, transfer, circuit 213 (283) can act as a direct map from register files to subsystem 200 memory (e.g., 233). Intermediate memory locations are bypassed and transfer circuit 213 (283) goes directly to a register file, which reduces latency.

As noted like AUX_PRU_0 205, PRU_0 219 also has accelerators. PRU_0 219 corresponds to PRU 116 of FIG. 1. As with PRU 116, PRU_0 219 has a task manager circuit 223. The primary difference between AUX_PRU_0 205 and PRU_0 219, is that PRU_0 219 interacts with interface circuit 104, receive circuit 105, transmission circuit 118 and interface circuit 119 (see FIG. 1), which are shown collectively in FIGS. 2A-C as interface circuit 225 (295). Interface circuit 225 (295) includes receive circuit 270 which includes level one FIFO transmit layer (TX_L1) 226 (296), and level two transmit layer (TX_L2) 262 (256) (see FIG. 1, 118). Transmit circuit 271 includes level one receiving layer (RX_L1) and level two receiving layer (RX_L2) 272 (257) (see 105, FIG. 1).

BS-RAM 214 (284) of PRU_0 219 of AUX_PRU 205 is the same as BS-RAM 204 (264). General purpose input/output (GPIO) circuit 215 (285) enables subsystem 200 to have access to additional hardwires of the SoC (e.g., 130, 246). Sigma-Delta circuit 216 (286) is an analog to digital converter which interacts with one or more external sensors (not shown). Sigma-Delta circuit 216 (286) converts a stream of analog data from the sensors to a stream of digital data. Sigma-Delta circuit 216 (286) is a filter. The data stream from the sensors corresponds to voltage or temperature at an external device such as a motor. Sigma-Delta circuit 216 (286) informs PRU_0 219 of certain events, for example if there is a spike in current, a spike in voltage, or a spike in temperature. PRU_0 219 determines what action, if any, needs to be taken because of the spike.

Peripheral interface 217 (287) is used for detecting a position or orientation of a device under control of subsystem 200, such as a motor or robotic joint. Peripheral interface 217 (287), for example, uses a protocol to determine the precise radial position of an arm. Sigma-Delta circuit 216 (286) and peripheral interface 217 (287) are thus used for device control, such as robotic control. Sigma-Delta circuit 216 (286) and peripheral interface 217 (287) are tightly coupled to the PRU_0 219, which enables subsystem 200 to be useful in industrial scenarios.

Packet streaming interface PSI 218 (288) of 219 is like PSI 211 (281) of 205 PSI. 211 (281) and PSI 218 (288) interact with navigation subsystem (NAVSS) PSI 210. However, while PSI 211 (281) has four receive (RX) inputs and one transmit (TX) output, PSI 218 (288) has a single transmit (TX) output. As noted, PRU_0 219 can move the register file of PRU_0 219 directly into the Ethernet wire (port) 253. Thus, a data packet enters through level one receiving layer (RX_L1) 227 of receive circuit 271 and level two receive layer (RX_L2) 272 (257) of receive circuit 271; there is no requirement to read memory or to go through DMA. Instead, the data packet can be immediately popped (pushed) to PRU_0 219 in a single data cycle. If necessary, the data packet can be pushed to level one transmit layer (TX_L1) 226 (296) or level two transmit layer (TX_L2) 262 (256) in the next clock cycle, which can be called a 'bridge-to-layer-cut-through' operation. In at least one a bridge-to-layer-cut-through operation is faster than a store and forward operation. The bridge-to-layer-cut-through operation can be performed while the data packet is pushed to the host 246 (for example, an SoC 130) via PRU_0 219 and port 245, or to slice_1 261, as the case dictates.

PRU_0 219 is a RISC CPU whose register file has access to an Ethernet buffer without the need to access or go through other memory. Interface 228 (298), interface 229 (299), and interface 230 (258) are physical media interfaces and include at least one RGMII. Real-time media independent interface 228 (298) is a 4-bit interface. Interface 229 (299) is a Giga-bit wide. Interface 229 (299) is a reduced Giga-bit media interface (RGMII). Interface 230 (258) is a serial Giga-bit media independent interface (SGMII). In one or more examples of these identified interfaces perform in real-time.

Ethernet interface circuit 225 (295) includes receive (RX) classifier circuit 232 (108) which takes rate data (107) and filter data (106) and other data, and based upon a predefined mapping function such as a time function, the classifier circuit 232 (108) classifies packets according to this mapping function. The packet's classification will determine the priority of the packet, which will dictate into which queue the packet will be placed (high priority queue, low priority queue, etc.). Port 253 of interface 225 (295) is essentially a wire dedicated to ethernet interface circuit 225 (295). Port 253 connects subsystem 200 to the physical layer. Broadside interface 252 (255) is the interface between PRU_0 219 and ethernet interface circuit 225 (295). As noted, 270 (273) and 271 (274) are FIFO-configured circuits. FIFO transmit circuit 270 (273) corresponds to transmit circuit 118 of FIG. 1, and FIFO receive circuit 271 (274) corresponds to circuit 105 in FIG. 1. The classifier circuit 232 operates on data while the data is pushed into FIFO circuit 270 (273).

Slice_0 201 and slice_1 261 share a number resources 301, such as illustrated in FIG. 2B. Slice_0 201 and slice_1 261 are coupled to each other via internal CBASS 248. Internal CBASS 248 is coupled to interrupt controller 236. Interrupt controller 236 is an aggregator that aggregates instances of events (recall there are 196 possible events). Some of the events can come from the host (130) 246, though most of events are internal to subsystem 200. Because there are a large number possible events, events must be aggregated or consolidated into a smaller number of super-packets for sharing with the data from a host (e.g., 246) at large. Software running on PRU_0 219 determines the mapping of source to an output destination.

As noted, subsystem 200 includes internal configurable bus array subsystem (CBASS) 248 as a shared resource. Internal CBASS 248 receives data from external CBASS 247 via a 32-bit slave port. Internal CBASS 248 communicates with dedicated memory_0 233, dedicated memory_1 234, and shared memory (SMEM) 235 (115). SMEM 235 is a general-purpose memory. SMEM 235 can be used for direct memory access (DMA) operations, for DMA instruction sets, and other functions. DMA is like a scratchpad (126, 127), and can contain control and state information. Internal CBASS 248 also communicates with enhanced capture module (eCAP) 237, which also communicates with external configurable bus array subsystem (CBASS) 247. Enhanced capture module 237 is a timer used for time management an external device, such as a motor.

In at least one example of this disclosure, subsystem 200 has different modes of operation. AUX_PRU_0 205 and PRU_0 219 each have a memory mapped register. The host 246 will write information to the configuration manager circuit 238. If, for example, the host 246 needs to enable RGMII mode, the configuration manager 238 will enable RGMII 229 (299), which is an example of a configuration register.

Universal asynchronous receiver-transmitter (UART) 239 is a hardware device for asynchronous serial communication in which the data format and transmission speeds are configurable. The electric signaling levels and methods are handled by a driver circuit external to the UART 239. UART must operate at a specific bod-rate, which requires a fixed clock rate. Asynchronous bridge (AVBUSP2P) 240 communicates with internal CBASS 248 and UART 239. UART 239, in turn, communicates with external CBASS 247. AVBUSP2P 240 is a bridge which allows for independent clocking of UART 239. External CBASS 247 is coupled to industrial Ethernet peripheral_0 (IEP0) 241 and industrial Ethernet peripheral_1 (IEP1) 273. IEP0 241 and IEP1 273 each include a timer, an EDIO, and a WD (122). IEP0 241 and IEP1 273 jointly enable two time-domain managements to run concurrently. The like AP 237 timers search for timer of IEP0 and IIP2 must operate on a given frequency (for example 200 megahertz), but the PRU can be decoupled from these. Likewise, if necessary, AVBUSP2P 240, AVBUSP2P 242, and AVBUSP2P 243 are couplers which allow the UART 239, IEP0 241 and IEP1 273 to operate at different frequencies.

As shown in FIG. 2B, there is a second AVBUSP2P circuit 242 is communicatively interposed between IEP0 241 and internal configurable bus array subsystem (CBASS) 248. There is also a third AVBUSP2P 243 communicatively interposed between IEP1 273 and internal CBASS 248. The subsystem 200 also includes pulse width modulator (PWM) 244, which is communicatively interposed between internal CBASS 248 and an external component.

Components 236, 237, 238, 239, 241, 273 and 244 each connect to a specific SoC wire. That is, they each communicate with IOs of host 246.

FIG. 2B also shows that subsystem 200 can include spinlock 249, AUX_SPAD 250, and PRU_SPAD 275. Spinlock 249 is a hardware mechanism which provides synchronization between the various cores of subsystem 200 (for example, 205, 219) and the host 246. Conventionally, a spinlock is a lock which causes a thread trying to acquire it atomically to simply wait in a loop ("spin") while repeatedly checking if the lock is available. Since the thread remains active but is not performing a useful task, the use of such a lock is a kind of busy waiting. Once acquired, spinlocks will usually be held until they are explicitly released, although in some implementations they can be automatically released if the thread being waited on (that which holds the lock) blocks, or "goes to sleep". A lock is a synchronization mechanism for enforcing limits on access to a resource in an environment where there are many threads of execution. A lock enforces a mutual exclusion concurrency control policy. Based on this principle, spinlock 249 provides for automaticity for operations of subsystem 200 components. For example, spinlock 249 enables each of the subsystem's cores (e.g., AUX_PRU_0 205) to access a shared data structure, such as a data structure stored in SMEM 235, which ensures that the various cores are updated at the same time. The access of the various cores is serialized by spinlock 249.

As shown in the example subsystem 200, auxiliary scratchpad (PRU SPAD) 250 and AUX SPAD 275 each hold three banks of thirty 32-bit registers. Subsystem 200 also includes a filter data base (FDB) 251 (109), which comprises two 8 kilobyte banks and a filter data base control circuit. FDB 251 is a broadside RAM that is accessed by AUX_PRU_0 205 and PRU_0 219. FDB 251 is also accessible by the hardware engine Sigma-Delta 216 (286) and peripheral interface 217 (287). Receive circuit 271 (which includes level one receiving layer (RX_L1) 227 (297) and level two receiving layer (RX_L2) 272 (257) can also access FDB 251. FDB 251 is a broadside RAM with respect to AUX_PRU_0 205 and PRU_0 219 to read and write entries, but the hardware also uses FDB 251 to provide an accelerated compressed view of packets arriving through port 253. The hardware will consult memory of FDB 251 using a hash mechanism and deliver the result to PRU_0 219 along with the packet. Determining where the packet goes next is a routing function. AUX_PRU_0 205 and PRU_0 219 access FDB 251 via the broadside interface of FDB 251 to add information and to delete information. The receive hardware 225 (295) can also access FDB 251.

Subsystem 200 can also include communications interfaces 225 (295), such as a network communication circuit that could include a wired communication component and/or a wireless communications component, which can be communicatively coupled to processor 205. The interface circuit 225 can utilize any of a variety of proprietary or standardized network protocols, such as Ethernet, TCP/IP, to name a few of many protocols, to effect communications between devices. Network communication circuits can also comprise one or more transceivers that utilize the Ethernet, power line communication Wi-Fi, cellular, and/or other communication methods.

As noted, in examples of this disclosure, data packets are processed in a real-time deterministic manner, unlike in conventional Ethernet or IEEE Ethernet processing, which defines more of a 'best efforts' traffic system in which packet loss occurs depending on the load of a given network. While conventional Ethernet management is acceptable for many applications, such as video streaming, in industrial settings, (for example, a robotic assembly line) sent data packets are (under ideal conditions) are delivered accurately and according to a predetermined schedule. In the industrial world packets must come according to a rigorous schedule. Of course, packet loss can occur in industrial environments but there are different means in layers (higher than level 1 and level 2, to which examples of this disclosure pertain) to take care of packet loss.

When a packet is received at level one receiving layer (RX_L1) 227 and/or level two receiving layer (RX_L2) 272 (257) from the physical layer (not shown), packet classifier 232 (108) analyzes the packet and identifies which portion of the packet is content (a/k/a 'payload'). The packet classifier (a/k/a 'packet classification engine') 232 then makes an on the fly decision regarding what to do with that packet. Ethernet bridge 225 (295) makes forwarding-and-receive decisions regarding each packet received (via receive circuit 271 and/or portal 253). In a conventional IEEE Ethernet bridge, such forwarding-and-receive operations are performed in a 'store and forward manner,' in which an incoming data packet is received in a first step, and once the data packet has been received, the content is then examined in a second step. In a conventional IEEE Ethernet bridge, once the packet is fully received and the content examined, a third step forwarding-and-receive determination is made. After the forwarding-and-receive determination is made, the data packet is then provided to a mechanical transmission layer, (such as via transmission element 226 (296). In at least one example of this disclosure, these steps are streamlined in a manner that minimizes latency and jitter. In at least one example, the classification engine 232 (260) is configured to perform the procedures of a conventional IEEE Ethernet bridge in an overlapping manner whereby by the time a packet has been completed received at 271(272) the classification engine 232 (260) has already determined what needs to be done with the packet, to what destination the packet needs to be sent, and by what route.

In examples of this disclosure, bridge delay is the amount of time between when a data packet arrives at a port 253 and goes out on another port 276. During the time between the ingress of the data packet and the egress of the data packet, there is, as noted the subsystem 200 makes a switching decision (determination) and then executes a transmit function. In the standard Ethernet IEEE world, the switching function is executed using a store and forward architecture which necessarily has a variable latency. Under variable latency conditions, there is no guarantee that when a data packet is received at time zero on the incoming port 253 (104, 105) that the data packet will go out at a fixed (known a priori) time on a different port (e.g., 276, 245). At least one benefit of subsystem 200 is that the classification engine 232 makes it possible to know that if a data packet is received at time zero, the packet will be sent out through another port (e.g., 245), within a predetermined (deterministic) period. In at least one example, this period is one microsecond. In at least one example, when a component, (such as slice_0 201), has such a short switching time, that component is deemed a real-time component, able to perform its assigned functions in 'real-time'. In examples of this disclosure, real-time computing (RTC) describes hardware and software systems subject to a "real-time constraint", for example from event to system response. For example, real-time programs must guarantee response within specified time constraints (a/k/a 'deadlines'). In some examples within this disclosure, real-time responses are in the order of milliseconds. In some examples within this disclosure, real-time responses are in the order microseconds.

Examples of this disclosure pertain to communication bridges which operate in real-time systems. A communication bridge is a real-time control system in which input data and output data are exchanged in a deterministic manner. Examples of this disclosure include a control device (e.g., 217 (287), 244) and multiple slave devices (not shown) or devices (not shown) which consume the input/output data from the control device 217 (287), 244 in real-time. The real-time system 100, 200 has a communication bridge 255 real-time capability. Thus, the amount of time to forward packets is deterministic, with minimum jitter and latency. In at least one example, jitter and latency are minimized (to range of a few nanoseconds) by a hardware timer (not shown) which defines the time when a packet leaves a physical port 253, 252 (255). The real-time operability of subsystem 200 is different from standard Ethernet, in which jitter of at least tens of microseconds is common. In such conventional systems, the amount of time taken to make forwarding/routing determinations varies in accordance with when a packet arrives, the rate at which the data packet is received, and the content of the packet. In a real-time system (e.g., 200) of this disclosure, there is a cyclic execution of switching functions. For example, new data can be exchanged in the subsystem 200 every 31 microseconds. A predetermined exchange rate (such as 31 microseconds) serves as a time reference. Depending on when a packet comes in (via port 253, for example), the packet is either forwarded with the deterministic latency (in this example, 31 microseconds), or alternately, the data packet is handled according to a store and forward manner, like that described above for conventional systems. Thus, packet arrival time can be a discriminator for how a given data packet will be treated by the subsystem 200. Another factor taken into consideration by receive (RX) classifier 232 in determining what to do with an incoming packet is the data (transmit) rate normally associated with the type of packet in question. For example, if the average data rate of for a received packet if it exceeds a certain data rate threshold, the system can drop (less consequential) data packets to help ensure that there is enough bandwidth for higher priority packets. In at least one example, classifier 232 determines how important a given data packet is based, at least in part, on the packet's payload.

In at least one example, the classifier circuit 232 (260) examines packet content by first accessing a location in the packet, such as the packet's Ethernet media access control (MAC) address. A MAC address of a device is a unique identifier assigned to a network interface controller (NIC)

for communications at the data link layer of a network segment. MAC addresses are used as a network address for most IEEE 802 network technologies, including Ethernet, Wi-Fi and Bluetooth. In at least one example, MAC addresses are used in the medium access control protocol sublayer of subsystem 200. In accordance with this disclosure MAC addresses are recognizable as six groups of two hexadecimal digits, separated by hyphens, colons, or using other notational systems.

Data packets can be filtered by filter 106 based on their designated delivery address (not shown). A data packet includes a six-byte source and destination address. In at least one example, interface circuit 225 (295) filters (106) packets based on that information. For example, interface circuit 225 (295) could read the packet's network address and determine whether to accept the packet, forward the packet or drop the packet. In at least on example, an accept-forward-drop decision can be based on a MAC header of the packet. In at least one example, in making an accept-forward-drop determination, an interface circuit can go further into the packet to the payload, and make filtering 106 determinations based on names which are in the payload. In some implementations of SoC 200, names of devices are connected in the payload, and then the content filter 106 looks at the payload. The broadside nature of the connection between BS-RAM 214 (404) and PRU_0 219 enables 32 bytes of information to be stored in or retrieved from the broadside RAM 214 within three clock cycles when the PRU_0 219 executes a store operation. PRU_0 219 can perform multiple mathematical operations on some or all of the very same 32 bytes of information during execution of the store operation.

In implementations of this disclosure, data packets will often contain multiple datagrams. This multiplicity of datagrams requires passing the packet, or portions thereof, to multiple addresses. Put another way, there can be multiple sub-packets in an Ethernet packet. Since the sub-packets can each have their own address, the addresses must be parsed. In situations where there are multiple addresses in one packet and the subsystem 200 will restart parsing each time a sub-address is detected. Thus, interface circuit 225 (295) will have a variable start offset for filters 106 to enable interface circuit 225 (295) to place multiple sub-packets in a single Ethernet packet. In at least one example, this means that sub-packets derived from a single data packet are sent to different devices (e.g., through peripheral interface 217 (287)); in examples of this disclosure, a single Ethernet packet can contain sub-packets, on or more of which are intended for (addressed to) different devices. Unless otherwise indicated, communications (packet exchange) of this disclosure are not point-to-point communications. Communications of this disclosure are based on a master device to slave device architecture. In implementations of this disclosure, a single master device (such as host 246 for example) controls tens, hundreds, or even thousands of slave devices.

Because of this asymmetrical relationship between master device and slaves, (1 to N, where N can be an extremely great number), and the requirement that communications occur in real-time, interface circuit 225 (295), which includes ingress filter hardware 106 is provided. The ingress filter 106, (and its attendant logic), in combination with ingress classifier 232 enables a hardware decision for real-time forwarding and processing. In examples of this disclosure, all of the information which must be read in order for a forward and receive determination to take place regarding a packet is located in the first 32 bytes in the packet. Once the first 32 bytes of that are read, PRU_0 219 can look up headers and additional headers, depending on the protocol with which the packet complies. The headers can be looked up (such as in filter data base 251) in real-time. Thus, once interface circuit 225 (295) has received the first 32 bytes of the packet, the interface circuit 225 (295) has sufficient information to determine whether to forward the packet, or whether to receive the packet, as described above. It should be noted that the 32-byte header size described is an example header size. Systems 100, 200 of this disclosure can be configured to work with packets that have other header sizes.

As noted, (packet) receive processing is done in real-time. In implementations of this disclosure, AUX_PRU_0 205, PRU_0 219, and interface circuit 225 (295) are programmable, and are configured such that all packet processing is completely deterministic. Receiving the 32 bytes of header information is done in interface circuit 225 (295) at a speed of 64 Giga-bit/second, which enables interface circuit 225 (295) to send 32 bytes of information forward or receive 32 bytes of information. The filters 106 of this disclosure are very flexible, insofar as they can be moved to filter a specific part of a packet. The filters 106 can be re-loaded by interface circuit 225 (295) as needed if there are multiple sub-packets. Additionally, interface circuit 225 (295) can apply a mask to set ranges of packets or addressees in packets and/or sub-packets. By grouping packets using greater than and less than operations, interface circuit 225 (295) can, for example, determine that when a packet has an address number from 15 to 29, that packet will be received. In some examples, binary masks can be applied, such that sub-packets having an address beginning with an even number, like 8-7, are forwarded, sub-packets having addresses beginning with odd numbers are not forwarded (at least not immediately). Thus, having a greater/less than operation for sub-packet address classification can be advantageous. In some examples, different filters such as 106 and 107 can be operationally combined with other components such as MAC 206 (266), 220 (290) to further process a packet by the packet's MAC address.

As noted, multiple filters can be combined for the interface circuit 225 (295) to make switching determinations. Additional logic can also be applied. For example, classifier 232 might classify a packet, and apply classification dependent logic, like 'for packet type A, if conditions one, two and three are true, then the packet will be received.' As another example, if a packet is classified as type B, if condition one is true and condition two is false, then the packet will be dropped. The subsystem 200 can be configured such that conditions can also include a time window in which a packet is received. For example, interface circuit 225 (295) could determine that at a certain point in time, the interface circuit 225 (295) will allow only very important (higher priority) input/output data to be forwarded. The interface circuit 225 (295) can be configured such that during a specified period (such as after a predetermined event has occurred), one set of filter combinations will be applied, whereas during other times all types of data traffic might be allowed. This described programmability is advantageous in industrial settings, as industrial communications operate based on hard time windows (in contrast to teleconferencing, for example.

In examples of this disclosure, multiple hardware filters can be combined with rate filters 107, such that data packets can be sorted according to rate as well. The filters 106, 107 and hardware 220 (290) operations used can be performed cumulatively. Packets can be filtered using any combination of content, time, and rate—all in real-time. A given filter 106 can be restarted multiple times for a packet. A filter 106 can have a start address whose value is determined, at least in part, on the content and/or type of content of a given packet/sub-packet.

In at least one example of this disclosure, interface circuit 225 (295) is configured to automatically detect whether a packet contains a virtual local area network (VLAN) tag. Some Ethernet packets have a tag for bytes of tag in the middle of a packet, or trailing a MAC address. It can occur that if a filter is applied to the data trailing the MAC address, the MAC address will be undesirably shifted by four bytes. Example interface circuits 225 (295) of this disclosure solve this problem by automatically detecting whether a packet has a VLAN tag, and if the packet does contain a VLAN tag, restarting the relevant filter 106 using the location of the VLAN tag as the start address. Thereafter, the interface circuit 225 (295) makes a determination, such as whether to receive or drop the packet using combinational logic, which can involve any appropriate combination of ANDs, ORs, and filter flags. In one or more examples of this disclosure, rate counters 107, which can be hardware rate counters, determines rates depending on the type of traffic in question and a predetermined time window for the packet's type. Thus, there can be a certain time for high-priority packets and a different time for non-real-time packets, and different filters can be applied depending on the situation. In some examples, filters 106 which yield immediate results during receive-time (on the fly) processing, will forward the packet in question regardless of the length of that packet. This operational capacity stands in stark contrast with that of conventional Ethernet, in which a packet is first received, one or more look up tables are consulted, and then a switching decision is finally made. In some examples of this disclosure, packet size is predetermined and communications occur at a fixed rate per packet. In other examples, information regarding packet length is contained within the header of the packet. In either case, packet length is determined in hard real-time on the fly.

At least one technical benefit of the architectures described in this disclosure is that they enable switching/forwarding determinations to be completed in a single microsecond, even for packets which have a length of up to twelve microseconds. The combinational logic of the interface circuit 225 (295) based on time, and data rate, enables the classification engine 232 to perform in a robust fashion. The ability of the subsystem 200 to restart a filter 106 to apply the filter 106 multiple times in a packet enhances the ability of the subsystem 200 to make packet switching decisions in real-time. In an example implementation, filter 106 which is limited in length. If a packet is longer than the filter, the filter 106 will need to be reloaded. If an Ethernet packet which contains sub-packets a filter 106 can be reused for multiple locations with the single packet. In some examples, sub-packets will each have their own address. If for example, a packet contains three subpackets, an address filter 106 can be loaded three times to apply the same address filter 106 to each sub-packet. PRU_0 219 writes data into TX_L2 via interface 252 (255), and the data then exits slice_0 201 along communications pathway 253. The real-time processing described supports the resource availability and allocation management which is described below.

Examples of this disclosure pertain to resource availability event messaging to real-time task managers (e.g., task manager circuit 223) for multi-core communication. At least one implementation of this disclosure is a system which efficiently manages resource sharing among multiple real-time tasks in a multi-core processing system for industrial communication. In at least example, a subsystem (e.g., subsystem 200) minimizes stall cycles typically associated with resource sharing, such as when a resource is currently unavailable, an associated hardware needing a task performed ends up polling for resource availability and wasting PRU cycles. In examples of this disclosure, such PRU cycles can be used for other real-time tasks, and when a resource becomes available a preempted task can be resumed. Thus, latency is reduced.

In at least one example, a task that a hardware component needs to have performed is pended onto an unavailable resource for 64 spinlock flags in real-time. When the resource becomes available, an event corresponding to the task manager (e.g., task manager circuit 209) is routed to task manager which then operates on the event and triggers the task which is waiting for the resource, depending on the priority of the task relative to other tasks. Multiple tasks can be pending on the same unavailable resource using spinlock 249 flags. In examples of this disclosure, critical tasks are performed immediately on resource availability and stall cycles are eliminated, thus making the best use of PRU cycles.

At least one example of this disclosure uses broadside instruction of PRUs in a system (e.g., 200) having multiple PRUs. In at least one example, a real-time task manager (e.g., task manager circuit 209) with an interrupt dispatcher provides low latency task switching. The ability to enable multiple tasks to be pending for same resource, and to have latency task switches on resource availability minimizes stall cycles which would be present in conventional systems.

At least one technical benefit of examples of this disclosure is that the examples enable high speed Industrial Ethernet and similar PRU firmware to save PRU cycles by avoiding stalls when a computational resource is currently unavailable to one or more circuits because that computational resource is currently being used by one or more other circuits. Examples of this disclosure include hardware support enables PRU (e.g., 205) firmware to avoid polling for resource availability, which is non-deterministic. Increased system determinism enables switching gigabit Ethernet packets with fixed latency and minimal jitter. Examples of this disclosure thus optimize PRU cycle usage for resource sharing in a multi-core processing system (e.g., subsystem 200). In at least one example, 64 spinlock flags are used to avoid stall cycles which would be used to continuously poll for resource availability in conventional systems. In various examples, the firmware of a first hardware component (e.g., PRU 205) will check for resource availability for a task only once, and then the use of the desired resource will be yielded as another task for another hardware component (e.g., PRU_0 219) is performed. The pending task will be re-triggered by real-time task manager (e.g., task manager circuit 209) when the resource is free for use by the waiting hardware component (e.g., PRU 205).

Examples of this disclosure pertain to the interoperability of PRU task managers (e.g., task manager circuit 112) with a spinlock circuit (e.g., 249) to manage access to shared resources (see FIG. 2B generally). Such task managers (e.g., 209) will, in most instances, operate in real-time. In various examples, to be able to operate at gigabit Ethernet speeds, FW of the task managers (e.g., 223) utilize registers. To accommodate different tasks, such as involved in packet switching (e.g., packet receive, transmit and background tasks like source address learning), task managers are configured to switch between mechanism is required. Working with the spinlock circuit 249, a task manager circuit (e.g., 223) will preempt a current PRU execution/task, save off key registers and start a new task that has a higher priority than the current task within ten nanoseconds after a hardware event triggering the new task. In one or more embodiments, firmware maps which one of a plurality (such as 64 or 70) of hardware events should cause the task swap to occur since task managers will be configured to respond to different hardware events and can prioritize tasks differently, which enables tight real-time task swapping that is optimal for a given task manager (on behalf of the task manager's respective PRU). Connections 150, 152, 154, 156, 158, 160, 162, 164, 252, and 255 are broadside connections, Connections 150, 152, 154, 156, 158, 160, 162, 164, 252, and 255 each include at least one broadside interface. These broadside interfaces enable 32-bytes of memory to be transferred across the interfaces in a single clock cycle.

Figure 3:
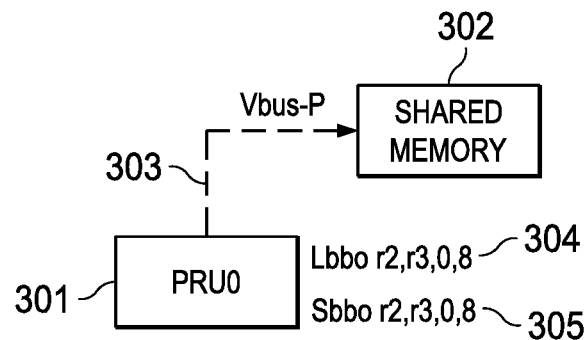
FIG. 3 illustrates an example relationship between a processor and a shared memory of FIGS. 2A-C.

FIG. 3 illustrates an example of a processor (PRU core (PRU0)) 301 accessing memory 302. FIG. 3 shows a data path between PRU 301, such as AUX_PRU_0 205 and PRU_0 219 of FIG. 2A, with a shared memory 302, such as SMEM 235 of FIG. 2B. PRU 301 interacts with shared memory 302 via Vbus-P 303, which corresponds to internal CBASS 248 of FIG. 2B. FIG. 3 thus shows an example of how a processor 301 can access shared memory. Processors such as PRU 301 can have specialized load-store instructions, represented in FIG. 3 by load instruction 304 and store instruction 305.

Figure 4:
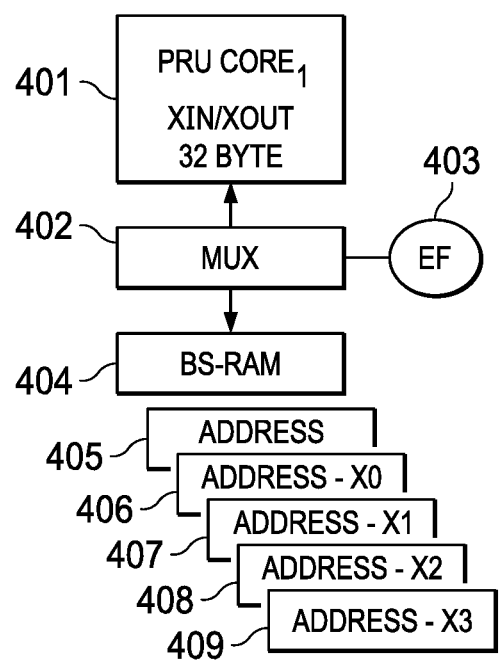
FIG. 4 illustrates an example relationship between a processor and a broadside RAM of FIGS. 2A-C.

FIG. 4 illustrates an alternative example of a processor (PRU core) 401 (205, 219, 301) accessing memory. However, unlike in FIG. 3, the memory is a BS-RAM 404. PRU core 404 is programmable. Although illustrated for ease of explanation as being external to PRU core 401, MUX 402 can be a component of, and internal to, the PRU core 401. Alternately, MUX 402 can be a component of an interface circuit (e.g., 225, 295). Extra functions 403 are available to the processor 401 beyond the memory aspects of BS-RAM 404. The extra functions 403 include such functions as are performed by accelerators such MAC 220, CRC 221 and BSWAP 224 in FIG. 2B. BS-RAM 404 also includes one or more internal address registers 405, each address register 405 storing one or more addresses, such as address-x0 406, address-x1 407, address-x2 408, and address-x3 409. Having multiple addresses makes BS-RAM 404 versatile. In at least one example, different addresses are assigned different task levels inside the cores (for example, AUX_PRU_0 205). In at least one example, having multiple addresses allows for logical structures to be overlaid onto the memory (for example, BS-RAM 214). Addresses 406, 407, 408 and 409 can be arranged in a FIFO logic structure.

In at least one example of this disclosure, the BS-RAM 404 is accessed via the processor broadside instructions. Xin will load data into processor registers from the broadside RAM 404, while Xout will store data from process registers to the BS-RAM 404. Each instruction has an XID parameter, that is used to route the load/store to the correct broadside-attached circuit. In an example, three XIDs are assigned to the BS-RAM 404 for the queue use case. The XIDs can be used to configure the BS-RAM 404 in queue mode and to return the status of the queue. An Xout to XID-S will set the address range for the queue, such as between addresses X and Y (e.g., 405, 406). Two addresses are maintained in the BS-RAM 404, one for a head pointer and one a tail pointer. In at least one example, XID-H is used with the head pointer and XID-T is used with the tail pointer address. With a BS-RAM 404 so configured, BS-RAM 404 can operate in queue mode.

In at least one example of this disclosure, a queue pop is implemented, in which the tail pointer will auto-increment by 1 and wrap back to a predetermined address, the tail pointer address value exceeds a predetermined address value.

While an SoC is primarily used throughout the above disclosure as an example type of chip, it will be appreciated that the techniques described herein may be applied in designing any type of IC chip. For instance, such IC chips may include a general-purpose or application-specific (ASIC) processor based upon x86, RISC, or other architectures, field-programmable gate array (FPGA), graphics processor (GPU), digital signal processor (DSP), a system-on-chip (SoC) processor, microcontroller, and/or related chip sets. By way of example only, the IC chip may be a model of a digital signal processor, an embedded processor, a SoC, or a microcontroller available from Texas Instruments Inc. of Dallas, Tex.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various implementations of the present disclosure. Numerous variations and modifications will become apparent to those skilled in the art once the above disclosure is fully appreciated. It is intended that the following claims be interpreted to embrace all such variations and modifications.

What is claimed is:

1. A computational device, comprising:
   a processor, wherein:
   the processor has an instruction set that has a first bit width,
   the processor includes a processor clock and a register, an interface coupled to the register; and
   a random-access memory (RAM) coupled to the interface, wherein:
   the RAM has a second bit width that is greater than the first bit width:
   the interface is configured to:
     store or retrieve accelerator state data from the register in a single clock cycle of the processor clock; and
     store or retrieve a set of data having the second bit width from the RAM within three clock cycles of the processor clock from when the processor executes a corresponding memory operation; and
   the processor is configured to perform one or more mathematical operations on at least one portion of the set of data during execution of the corresponding memory operation.

2. The computational device of claim 1, further comprising:
   a glue logic coupled to the processor, and wherein the processor is further configured to store an address of the RAM in the glue logic, the address corresponding to an address most recently accessed by the processor.

3. The computational device of claim 1, further comprising:
a checksum circuit, and
wherein the processor is further configured to perform the one or more mathematical operations on the at least one portion of the set of data during execution of the corresponding memory operation by performing a checksum operation on the at least one portion of the set of data during the execution of the corresponding memory operation using the checksum circuit.

4. The computational device of claim 1, wherein the processor is further configured to perform an endian flipping operation on the at least one portion of the set of data during the execution of the corresponding memory operation.

5. The computational device of claim 1, wherein the processor is further configured to transpose a first content of the register with a second content of the register.

6. The computational device of claim 1, wherein the processor is further configured to implement a queue data structure using the RAM in an address auto-increment mode.

7. The computational device of claim 1, wherein the processor is further configured to implement a first-in-first-out data structure using the RAM in an address auto-increment mode.

8. The computational device of claim 1, wherein the processor is further configured to implement a last-in-first-out data structure using the RAM in an address auto-increment mode.

9. The computational device of claim 1, further comprising a filter database connected to the RAM, and wherein the RAM is further configured to perform look up operations using the filter database.

10. The computational device of claim 1, wherein the first bit width is 32 bits and the second bit width is 32 bytes.

11. A computer-implemented method, comprising:
loading, using an interface, accelerator state data to a register in a single clock cycle of a processor coupled to the register;
executing a memory operation using the processor, wherein the executing of the memory operation comprises loading or storing a set of data to a RAM coupled to the interface, in less than four clock cycles of the processor, wherein:
the processor has an instruction set having a first bit width; and
the RAM has a second bit width that is greater than the first bit width; and
performing, using the processor, one or more mathematical operations on at least one portion of the set of data during the execution of the memory operation.

12. The computer-implemented method of claim 11, further comprising:
performing, using the processor, a checksum operation on the at least one portion of the set of data during the execution of the memory operation using a checksum hardware circuit.

13. The computer-implemented method of claim 11, further comprising performing, using the processor, an endian flipping operation on the at least one portion of the set of data during the execution of the memory operation.

14. The computer-implemented method of claim 11, further comprising, transposing, by the processor, a first content of a first plurality of registers coupled to the processor, with a second content of a second plurality of registers coupled to the processor.

15. The computer-implemented method of claim 11, further comprising implementing, by the processor, a queue data structure by using the RAM in an address auto-increment mode.

16. The computer-implemented method of claim 11, further comprising implementing, by the processor, a FIFO data structure by using the RAM in an address auto-increment mode.

17. A system on chip, comprising:
a programmable real-time unit, wherein:
the programmable real-time unit is responsive to an instruction set having a first bit width: and
the programmable real-time unit includes a register;
an interface circuit coupled to the register; and
a random-access memory (RAM) coupled to the interface circuit,
wherein the interface circuit is configured to load or store accelerator state data to the register in a single clock cycle of the programmable real-time unit;
the interface circuit is further configured to load or store a set of data having a second bit width that is greater than the first bit width to the RAM within one clock cycle of the programmable real-time unit when the programmable real-time unit executes a memory operation; and
wherein the programmable real-time unit is configured to perform one or more mathematical operations on at least one portion of the set of data during execution of the memory operation.

18. The system on chip of claim 17, further comprising:
a glue logic circuit coupled to the programmable real-time unit, and wherein the programmable real-time unit is further configured to store an address of the RAM using the glue logic circuit, the address corresponding to an address most recently accessed by the programmable real-time unit.

19. The system on chip of claim 17, further comprising:
a checksum circuit, and
wherein the programmable real-time unit is further configured to perform the one or more mathematical operations on the at least one portion of the set of data during the execution of the memory operation by performing a checksum operation on the at least one portion of the set of data during the execution of the memory operation using the checksum circuit.

20. The system on chip of claim 17, wherein the first bit width is 32 bits and the second bit width is 32 bytes.

* * * * *